United States Patent
Noonan et al.

(10) Patent No.: US 6,310,782 B1
(45) Date of Patent: *Oct. 30, 2001

(54) APPARATUS FOR MAXIMIZING MEMORY DENSITY WITHIN EXISTING COMPUTER SYSTEM FORM FACTORS

(75) Inventors: Robert W. Noonan, Cypress; Jeffrey L. Hooten; Christian H. Post, both of Spring, all of TX (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/741,699

(22) Filed: Oct. 31, 1996

(51) Int. Cl.[7] ..................................................... H05K 7/02
(52) U.S. Cl. ..................... 361/783; 361/760; 361/801; 361/807; 361/809; 257/678; 257/723
(58) Field of Search .................................. 257/700, 723, 257/724; 361/729, 728, 730, 733, 736, 754, 784, 785, 796, 797, 798, 801, 803, 807, 809, 760, 783; 439/59, 61, 62, 65, 152, 157, 153; 365/51, 52

(56) References Cited

U.S. PATENT DOCUMENTS

| | | | |
|---|---|---|---|
| 3,676,746 | * 7/1972 | Kassabgi et al. | 361/796 |
| 3,993,935 | * 11/1976 | Phillips et al. | 439/61 |
| 4,109,298 | * 8/1978 | Hanni et al. | 361/784 |
| 4,685,031 | * 8/1987 | Fife et al. | 361/796 |
| 4,882,700 | 11/1989 | Mauritz et al. | 365/51 |
| 4,898,540 | * 2/1990 | Saito | 439/153 |
| 5,036,481 | 7/1991 | Lunsford et al. | 361/686 |
| 5,095,407 | * 3/1992 | Kanezawa et al. | 361/796 |
| 5,103,247 | * 4/1992 | Sugano et al. | 361/785 |
| 5,138,434 | 8/1992 | Wood et al. | 257/696 |
| 5,191,224 | 3/1993 | Tazunoki et al. | 257/724 |
| 5,200,917 | * 4/1993 | Shaffer et al. | 365/52 |
| 5,202,754 | 4/1993 | Bertin et al. | 257/684 |
| 5,224,023 | 6/1993 | Smith et al. | 361/784 |
| 5,272,664 | 12/1993 | Alexander et al. | 365/52 |
| 5,349,235 | 9/1994 | Lee et al. | 257/693 |
| 5,382,830 | * 1/1995 | Akyürek et al. | 361/807 |
| 5,446,317 | 8/1995 | Sato et al. | 257/734 |
| 5,455,744 | * 10/1995 | Watanabe | 361/801 |
| 5,532,519 | 7/1996 | Bertin et al. | 257/777 |
| 5,581,127 | 12/1996 | Shinohara | 257/679 |

FOREIGN PATENT DOCUMENTS

| | | | |
|---|---|---|---|
| 5-727 | * 4/1993 | (JP) | 257/727 |
| 5-343579 | * 12/1993 | (JP) | 257/700 |
| 08139232 | 5/1996 | (JP) . | |

OTHER PUBLICATIONS

IBM Technical Disclosure Bulletin "Stacking Single Inline Memory Module Card" vol. 37 No. 10 pp. 353 and 354, Oct. 1994.*

European Search Report, regarding counterpart European application No. EP97308436; 2 pages; Mar. 4, 1999.

* cited by examiner

*Primary Examiner*—Donald Sparks
(74) *Attorney, Agent, or Firm*—Fletcher, Yoder & Van Someren

(57) ABSTRACT

A system includes a memory module formed of a first portion having a first side that directly connects to a mount in the system, which first side is of a first length; and a second portion having a second side, which second side is of a second length, the second length being greater than the first length. The second side may comprise an arcuate form or a plane that is different from the plane of the first side. Each of the first and second portions is used for affixing a memory element.

11 Claims, 3 Drawing Sheets

APPARATUS FOR MAXIMIZING MEMORY DENSITY WITHIN EXISTING COMPUTER SYSTEM FORM FACTORS

BACKGROUND OF THE INVENTION

1. Field of the Invention

The present invention relates generally to memory modules. More particularly, the present invention relates to memory module form factors that maximize memory density.

2. Description of Related Art

One aspect of the evolution of computer systems is that operating systems and software have become more memory-intensive. In fact, this particular trend has become so marked that the memory industry has had a very difficult time keeping up with the demand, both from a supply and development standpoint.

Dynamic Random Access Memory (DRAM) semiconductor chips are the primary components used in memory systems. DRAM's are generally made using complimentary metal oxide silicon technology ranging from 0.8 to 0.3 microns in size, with the smaller sizes becoming increasingly prevalent.

While DRAM's have been getting smaller in size, their density has been increasing rapidly. For example, several years ago, 1 Mb and 4 Mb DRAM chips were standard. Today, 16 Mb chips are standard; 64 Mb chips are on the horizon; and 256 Mb and 1 Gb chips are being developed and made.

Also, DRAM packaging has been evolving. Several years ago, memory was pin throughhole packaged. Today, with the common use of surface mount technology, small outline integrated circuit (SOIC), thin small outline package (TSOP), and like configurations are most common.

Memory modules serve at least two functions. One function is to make DRAM's compatible with the system bus organization, that is, reflective of the system designer' desire to match the processor bus size. Second, memory modules allow for easy upgrades.

Today, memory modules come in four basic types: one-byte modules (30-pin single-in-line memory modules (SIMMS), four-byte modules (72-pin SIMMs or 72-pin small outline, dual in-line memory modules (SODIMMs), eight-byte modules (168-pin DIMMs), and custom modules (e.g., HP 9000 workstation memory). SIMMs were first developed by Wang in the mid-1970's in conjunction with Molex, the connector supplier for Wang's "office assistant" word processor. While SIMMs have, generally, 30 or 72 contacts that are the same on both sides of the "card," DIMMs have two (dual) rows of contacts, one row on each side of the card. With the additional pins, a computer can retrieve information from DIMMs 64 bits at a time instead of the 32 or 16-bit transfers usual with SIMMs. SODIMMs have 72-pins, making them relatively compact and thus particularly well suited for memory expansion in portables.

Notwithstanding all of the foregoing developments, there still remains an urgent need to continue to develop methods and apparatus for maximizing DRAM density within the space constraints of existing computer systems. To the extent this has been attempted or effected by manipulating the form of memory modules, system designers have made modules higher or taller. In many systems there is a limit as to how high or tall such a module can be, limiting usefulness of this approach. It is a shortcoming and deficiency of the prior art that heretofore there has not been envisioned a way to maximize DRAM density in systems, by manipulating the form of memory modules in a way that does not make them too tall to fit in many systems.

SUMMARY OF THE INVENTION

The present invention overcomes the shortcomings and deficiencies mentioned above by providing a system including a memory module formed of a first portion having a first side that directly connects to a mount in the system, which first side is of a first length; and which memory module is also formed of a second portion having a second side, which second side is of a second length, the second length being greater than the first length.

In a preferred embodiment of the present invention, the second side extends beyond the first side in two directions, thereby forming a "T-shape".

In alternative embodiments of the present invention, the second side defines a nonlinear element, such as an arc.

The present invention also provides a method for increasing memory capacity in a system, which method includes the steps of providing a module with an area that extends beyond its connector footprint, mounting memory elements on the module so that at least a portion of memory is disposed in the area that extends beyond the module's connector footprint, and connecting the memory module with memory mounted thereon to the system.

Accordingly, an object of the present invention is to provide simple methods and apparatus for maximizing DRAM density within the space constraints of existing computer systems.

Another object of the present invention is to introduce new forms of memory modules, so there is greater choice in how memory can be disposed in systems which use the memory.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE EXEMPLARY EMBODIMENTS OF THE PRESENT INVENTION

Figure 1:
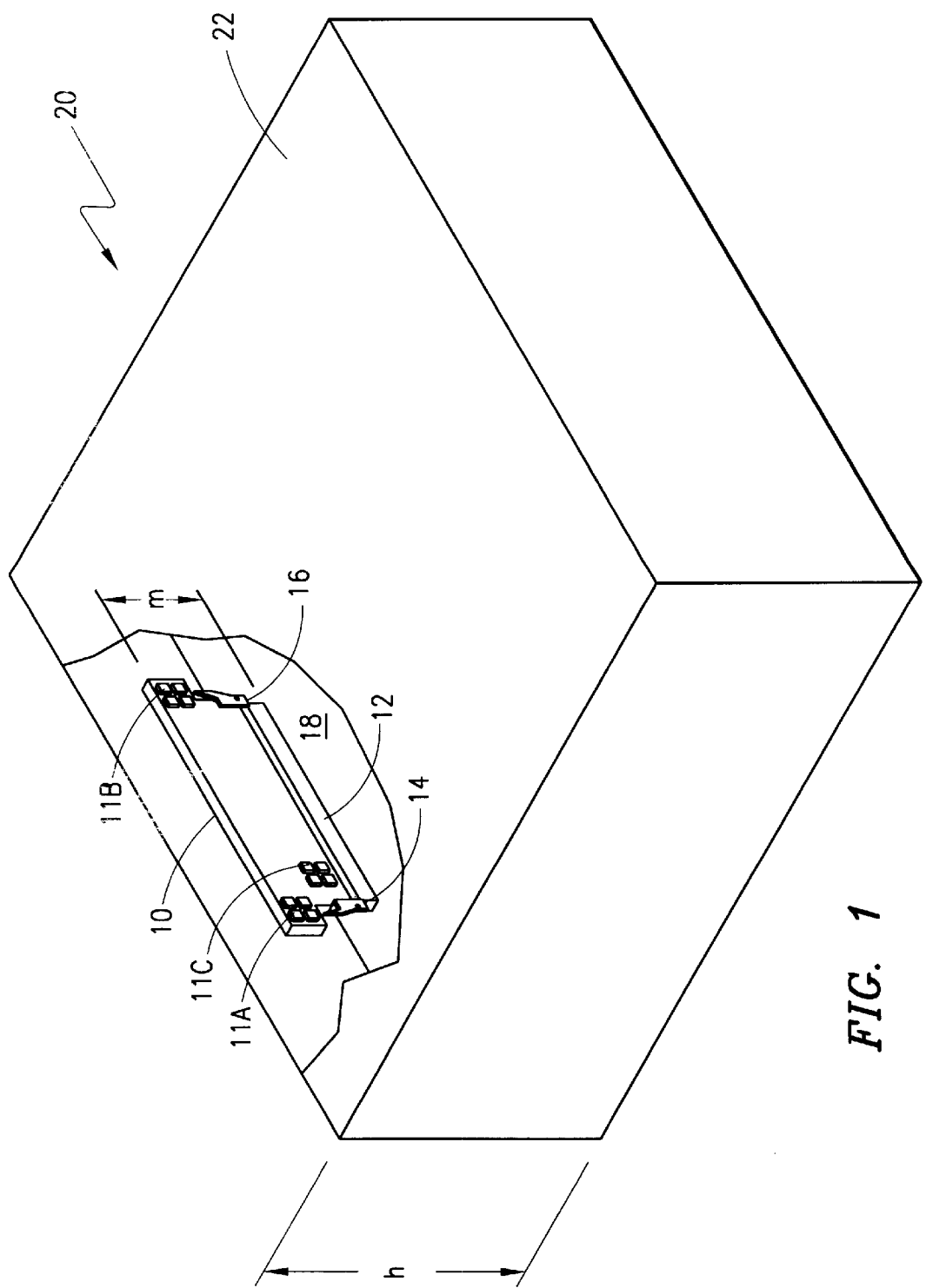
FIG. 1 is a simplified, partially cut-away drawing of a computer housing in which a memory module according to the teachings of the present invention is installed.

Referring now to the drawings wherein like or similar elements are designated with identical reference numerals throughout the several views, and wherein the various elements depicted are not necessarily drawn to scale, and in particular, to FIG. 1, there is shown a preferred embodiment of the present invention in the form of a memory module 10. Memory module 10 is shown in FIG. 1 to be mounted in a slot 12, and held by retaining arms 14, 16, on a board 18 in computer system 20. Computer system 20 in FIG. 1 is depicted as a housing 22 that is partially cut away to show module 10. It should be understood by the reader hereof that a number of conventional details are not shown in this FIG. For example, housing 22 would likely be formed in parts to allow ready access to internal components; those parts are not depicted. Furthermore, computer system 20 would also likely comprise a processor, power supply, hard drive, and other conventional components; those components are not depicted either. The instant invention resides in the form of memory modules; that being so, aspects of system 20 that do not directly affect, or are not directly involved in the operation of the module 10, which aspects would not help clarify or explain the instant invention, are not depicted herein. In general fact, conventional computer systems generally include slots and retaining arms for the mounting of memory modules. A memory module according to the teachings of the present invention should be understood as being readily insertable into and retainable by such "prior art" slots and arms.

Continuing to refer to FIG. 1, there is, however, one aspect of the instant invention that should be noted here: that aspect being that the module 10 readily fits within the confines of the housing 22. More specifically, in FIG. 1 the housing 22 may be seen to have a height "h." The memory module 10, on the other hand, has a height "m," taking into account its elevated status in the slot 12, with height "m" clearly being less than "h." In the evaluation of computer systems, especially insofar as that evolution has led to development of notebook computers, which have very small heights "h's," there is less and less "real estate" or space for conventional memory modules for memory elements. As those skilled in the art are well aware, conventional memory modules are rectangular, with the length of the module base being fixed by the size of conventional slots into which the modules are inserted. Thus, if it is desired to increase the number of memory elements associated with a conventional memory module, the conventional memory module must be made taller. Once again, the value of "h" is a limit on such growth. In the case of notebook and subnotebook computers, "h" can be quite small, greatly limiting the amount of memory density within the system.

Figure 2:
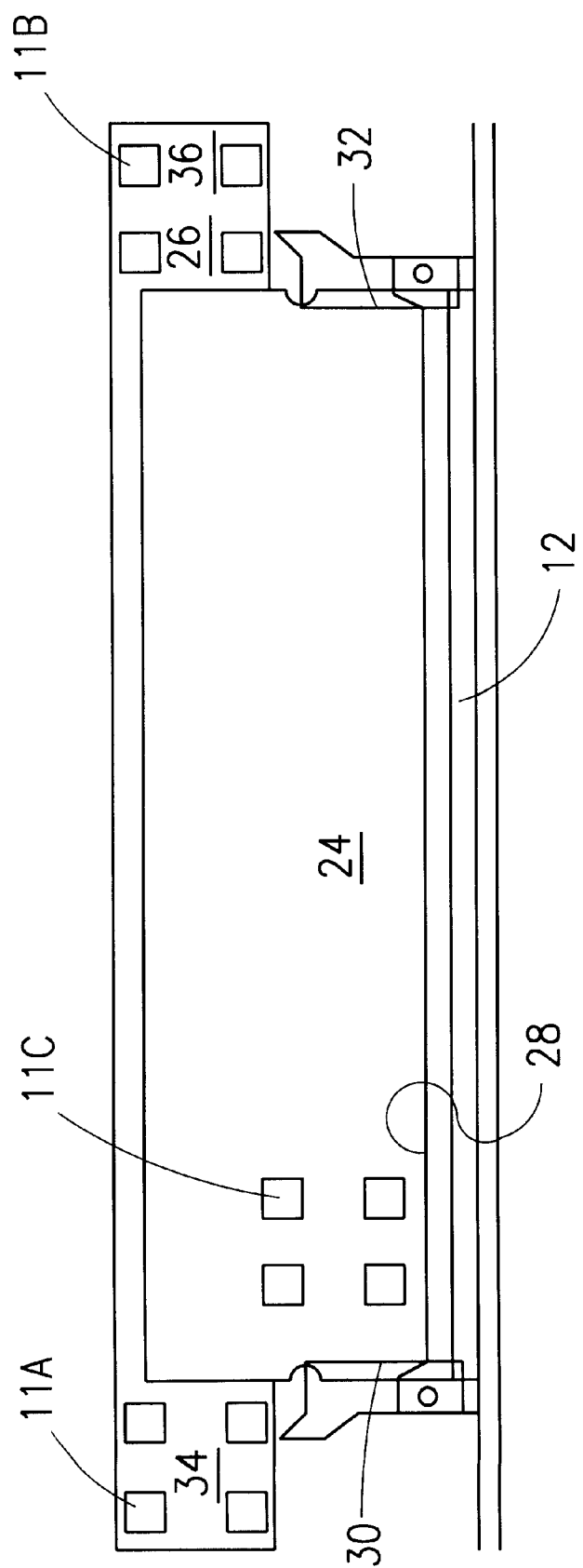
FIG. 2 is a plan view of the memory module of FIG. 1.

Referring now to FIG. 2, the memory module 10 can be seen in greater detail. In very general terms, it can be seen that memory module 10 has an increased amount of real estate relative to prior art memory modules, without an overly limiting increase in height, by comprising a first portion 24 and a second portion 26. The first portion is like conventional memory module, insofar as it is rectangular, with a base 28 generally equal in length to the slot 12 in which it is inserted. The second portion 26, however, constitutes a dramatic departure from the prior art. The second portion 26 projects beyond the sides 30, 32 to effectively form a broad "T-shaped" element. The two projecting portions of that "T-shaped" element, portions 34, 36, comprise areas on which memory elements (for example, elements 11A and 11B) can readily be mounted, and yet which areas do not fully project above the first portion 24 so as to increase the height of the memory module 10.

As an aside, also shown in greater detail in FIG. 2 are arms 14, 16. Arms 14, 16 should be recognized as rotatably mounted at each end of the slot 12. When a module is not in slot 12, the upper portions of the arms 14, 16 tilt away from the slot 12. If and as a memory module, e.g., module 10, is inserted in the slot 12, the base 28 of the module will push the bottom portions of the arms away from the slot, causing the upper portions of the arms to swing into the slot and module, and to interact with the module in any number of known ways, to facilitate alignment and/or retention of the module 10 in slot 12.

Figure 3:
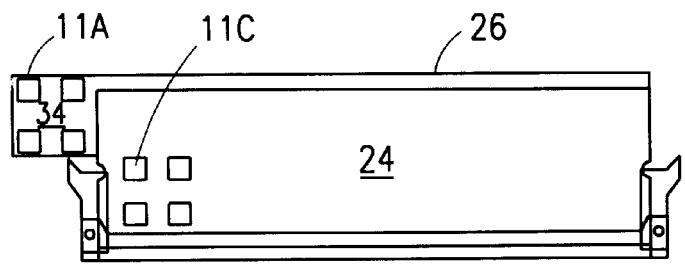
FIG. 3 is a plan view of a first alternative embodiment of a memory module according to the teachings of the present invention.

Referring now to FIG. 3, there is depicted an alternative form of a memory module according to the teachings of the present invention. This embodiment differs from the embodiment of FIGS. 1 and 2 insofar as it has only a single projecting portion 34, and not also a second projecting portion 36. Still, it should be appreciated that this form of module offers additional real estate for the mounting of memory element, which additional real estate does not effectively increase the height of the module.

Figure 4:
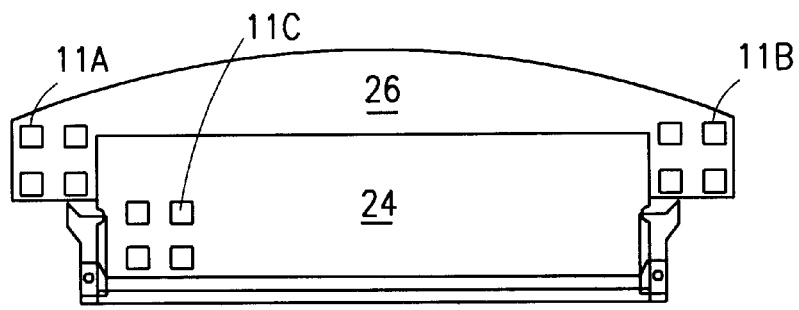
FIG. 4 is a plan view of a second alternative memory module according to the teachings of the present invention.

Referring now to FIG. 4, there is depicted yet another alternative form of a memory module according to the teachings of the present invention. In that FIG., it can be seen that the module is not "T-shaped" because the upper edge of the second portion is non-linear—in fact, it is arc-shaped. In broad terms, the present invention is simply a form of memory module where real estate is increased by means other than a straight, direct increase in height. In the embodiment of FIG. 4, there is an increase of real estate both to the sides and upward; the increase is clearly not 100% tied to an increase in height, however, as exclusively taught by the prior art.

Figure 5:
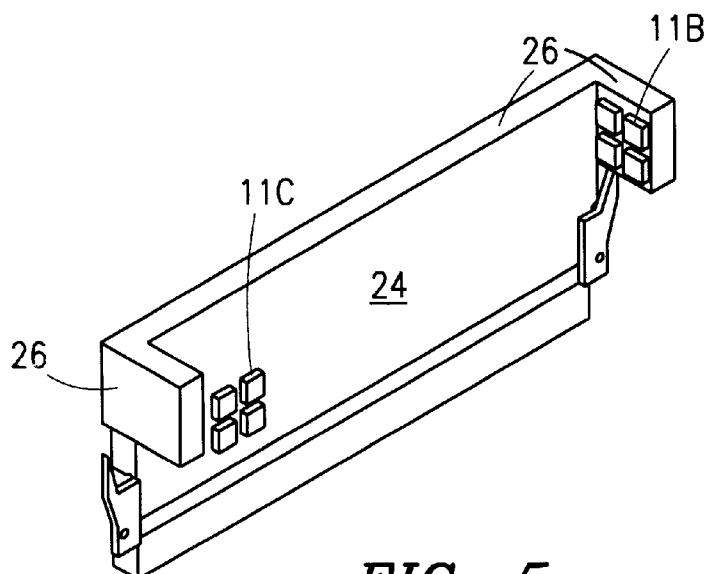
FIG. 5 is a perspective view of a third alternative memory module according to the teachings of the present invention.

Referring now to FIG. 5, there is yet another alternative embodiment of the present invention. This embodiment differs from previously discussed embodiments insofar as second portion 26 may be seen to lie, in part, in a different plane from first portion 24 (in fact, second portion 26 lies in three planes, only one of which is the plane of first portion 24). This embodiment, although not "flat" like previous embodiments, offers greater real estate for mounting memory elements without requiring an increase in height. It can also, in certain circumstances, make the best use possible of constrained space.

Looking at the instant invention in another way, the instant invention comprises a memory module with an area that extends beyond its connector footprint. Couched in method terms, the instant invention is practiced when memory elements are mounted on such a module so that at least a portion of the memory is disposed in the area that extends beyond the module's connector footprint, and when such a memory module is connected to a computer system.

Based upon the foregoing, those skilled in the art should now recognize and appreciate how the present invention effectively introduces new forms of memory modules, and how the present invention also provides simple methods and apparatus for maximizing DRAM density within the space constraints of existing computer systems. Towards this end, those skilled in the art should also readily understand and appreciate how the advantages of the present invention can be maximized by use of SOIC (small plastic dual in-line packages, usually with "gull wing" feet, designed for surface mounting) and SOJ ("Small outline, J bend"—i.e., an SOIC package with j-bend leads) packages. Being "small outline" packages, they inherently take up less precious real estate on the module. Those skilled in the art should also readily understand and appreciate how the present invention offers a module designer a greater number of options regarding buffer placement on modules, which follows also from the greater amount of real estate available.

Although preferred embodiments of the method and apparatus of the present invention have been illustrated in the accompanying drawings and described in the foregoing detailed description, it will be understood that the invention is not limited to the embodiment disclosed, but is capable of numerous rearrangements, modifications and substitutions without departing from the spirit of the invention as set forth and defined by the following claims. For example, while the preferred embodiments depicted and described herein have been discussed as having "height" limitations, it should also be understood that they could be disposed in systems in other than "standing up" attitudes, which would effectively impose what would be more accurately referred to as "length" limitations. Other attitudes are possible. Still, the fact remains that evolving computer systems include less and less space for memory modules, and such modules can grow more effectively in more than one, rather than merely one, direction.

What is claimed is:

1. A system including a memory module, said module having a plurality of memory elements, the module comprising:

a first portion having a first side and a first area, said first side for directly connecting to a mount in the system, which first side is of a first length; and a second portion having a second side and a second area, which second side is of a second length, the second length being greater than the first length, said second side defining an arc;

wherein at least one of said plurality of memory elements is affixed to at least one of said first area and said second area.

2. The system as recited in claim 1, wherein said second side is at least generally parallel to said first side, and wherein said second side extends beyond said first side in at least one direction.

3. The system as recited in claim 2, wherein said second side extends beyond said first side in two directions, thereby forming a "T-shape."

4. A computer system comprising:

a memory module, said memory module having a plurality of memory elements;

said memory module including a first portion having a first side and a first area, said first side for directly connecting to a mount in the system, said first side is of a first length; and said memory module further including a second portion having a second side and a second area, said second side is of a second length and defines an arc, the second length being greater than the first length;

wherein at least one of said plurality of memory elements is affixed to at least one of said first area and said second area.

5. The computer system as recited in claim 4, wherein said second side is at least generally parallel to said first side.

6. The computer system as recited in claim 4, wherein said second side extends beyond said first side in at least one direction.

7. The computer system as recited in claim 4, wherein said second side extends beyond said first side in two directions, thereby forming a "T-shape".

8. A computer system comprising:

a memory module including a first portion and a second portion;

said first portion of said memory module having a first side and a first area, said first side for directly connecting to a mount in the system, said first side being of a first length;

said second portion having a second side and a second area, said second side being of a second length and defining an arc, said second length being greater than said first length; and a plurality of memory elements affixed to at least one of said first area and said second area.

9. The computer system as recited in claim 8, wherein said second side is at least generally parallel to said first side.

10. The computer system as recited in claim 8, wherein said second side extends beyond said first side in at least one direction.

11. The computer system as recited in claim 8, wherein said second side extends beyond said first side in two directions, thereby forming a "T-shape".

* * * * *